United States Patent

Azdasht

[19]

[11] Patent Number: 6,072,148
[45] Date of Patent: Jun. 6, 2000

[54] DEVICE FOR PRODUCING CONNECTIONS BETWEEN TWO RESPECTIVE CONTACT ELEMENTS BY MEANS OF LASER ENERGY

[75] Inventor: Ghassem Azdasht, Berlin, Germany

[73] Assignee: Fraunhofer-Gesellschaft Zur Forderung Der Angewandten Forschung E.V., Germany

[21] Appl. No.: 08/987,881

[22] Filed: Dec. 8, 1997

[30] Foreign Application Priority Data

Dec. 10, 1996 [DE] Germany ........................... 196 51 266
Dec. 11, 1996 [DE] Germany ........................... 196 51 596
Nov. 11, 1997 [DE] Germany ........................... 197 49 909

[51] Int. Cl.[7] ................................................. B23K 26/00
[52] U.S. Cl. ..................................................... 219/121.63
[58] Field of Search ........................ 219/121.63, 121.64; 228/180.21, 180.22, 234.1, 235.1

[56] References Cited

U.S. PATENT DOCUMENTS

| | | | |
|---|---|---|---|
| 4,620,663 | 11/1986 | Odashima et al. | 219/121.63 |
| 4,682,001 | 7/1987 | Locke | 219/121.63 |
| 4,963,714 | 10/1990 | Adamski et al. | 219/121.63 |
| 5,289,966 | 3/1994 | Izumi et al. | 219/121.64 |
| 5,565,119 | 10/1996 | Behun et al. | |
| 5,580,471 | 12/1996 | Fukumoto et al. | 219/121.63 |
| 5,956,607 | 9/1999 | Evers | 219/121.63 |

FOREIGN PATENT DOCUMENTS 42 00 492  4/1993  Germany.

*Primary Examiner*—Geoffrey S. Evans
*Attorney, Agent, or Firm*—Dougherty & Associates

[57] ABSTRACT

A device for producing by means of laser energy a plurality of connections between contact elements of respective contact element pairs has a holding arrangement for holding a plurality of optical fibers having respective optical fiber ends. A positioner is provided for positioning the holding arangement and the contact element pairs at a predetermined position relative to one another, at which a respective optical fiber end is associated with a pair of contact elements, the connection surfaces of the contact elements of said pair of contact elements being pressed onto one another by a pressure applied by said optical fiber. Said connecting device additionally comprises a device for compensating different distances between the optical fiber ends and the surfaces of the associated contact element pairs facing said optical fiber ends, in such a way that the connection surfaces of the contact elements are pressed onto one another.

19 Claims, 8 Drawing Sheets

Fig.C

*Fig.5A*
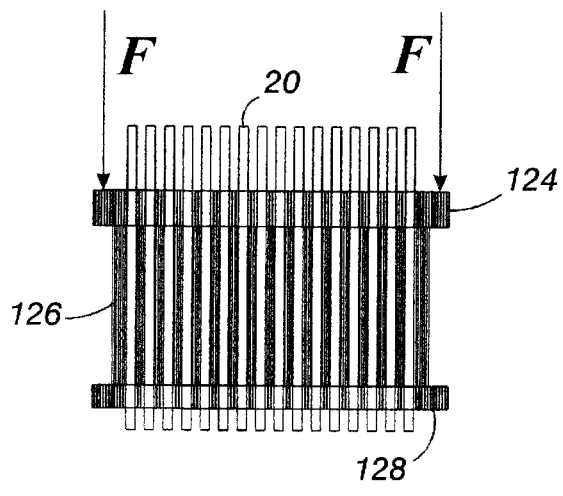
*Fig.5B*
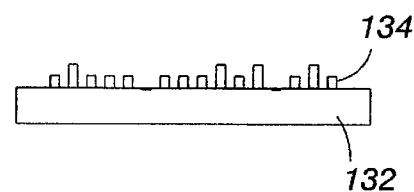
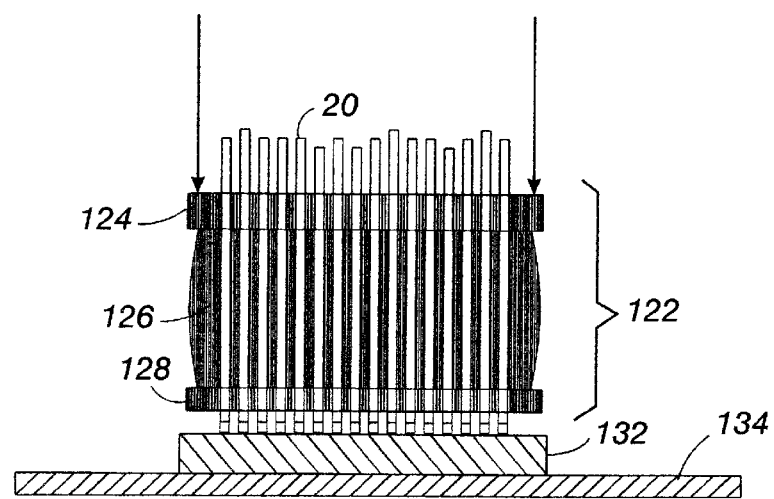
*Fig.5C*

DEVICE FOR PRODUCING CONNECTIONS BETWEEN TWO RESPECTIVE CONTACT ELEMENTS BY MEANS OF LASER ENERGY

BACKGROUND OF THE INVENTION

1. Field of the Invention

The present invention refers to a device for producing by means of laser energy a plurality of connections between contact elements of respective contact element pairs, said contact element pairs being arranged essentially in one plane and the contact element surfaces to be connected extending essentially parallel to this plane.

The present invention is, for example, used for producing bonds in the field of SMD technology (SMD=surface mounted device). In addition, the present invention is adapted to be used in the TAB technology (TAB tape automatic bonding=automatic film bonding) for bonding inner and outer connecting leads, the so-called inner-lead and outer-lead bonding.

Furthermore, the present invention can also be used for connecting fine wires or little tapes or the like.

2. Description of Prior Art

U.S. Pat. No. 4,845,335 describes a device for electrically connecting contact elements in the case of which contacts located on a TAB tape are connected to the contacts of an integrated circuit. In so doing, the contacts on the tape are brought into superpostion with the contacts on the integrated circuit, whereupon said contacts are interconnected by means of laser radiation. In order to achieve a good reproducability of the connections, the distance between the contacts to be connected must be minimized. According to a general rule, the distance must not be larger than approx. 10% of the thickness of the contact elements. With an increasing degree of miniaturization, the connections become smaller and smaller, whereby the dimensions of the contact geometries decrease so that it becomes problematic to fulfil these requirements.

In U.S. Pat. No. 4,845,335 a gas stream is used for applying pressure to the contact elements, said gas stream being directed onto the contact elements by means of a nozzle and the laser beam used for connection and the gas stream produced by said nozzle being coaxial.

The known device is, however, not optimal for connecting contact elements by means of laser energy, since the laser energy available is not optimally converted into thermal engery for connecting the contacts.

DE-A-3941558 discloses a laser connecting device which is suitable for spot welding, brazing or soldering. In this known device, the laser energy is conducted to the connection point by means of an optical fibre. In so doing, the optical fibre is held in a tool, which serves as a holder, in spaced relationship with the connection point, a pressure being applied to the connection point, i.e. the contact elements to be connected, via said tool.

DE-A-1958430 describes a device for connecting contact elements by means of a laser welding process, said device making use of a quartz mandrel for transmitting the laser energy to the connection point. The quartz mandrel also serves to apply a pressure to the connection point.

SUMMARY OF THE INVENTION

It is the object of the present invention to provide a device for producing connections between contact elements by means of laser energy, which permits a plurality of connections between contact elements to be produced simultaneously while efficiently exploiting and converting the laser energy.

The present invention provides a device for producing by means of laser energy a plurality of connections between contact elements of respective contact element pairs, said contact element pairs being arranged essentially in one plane and the contact element surfaces to be connected extending essentially parallel to this plane. The device has a holding arrangement for holding a plurality of optical fibres having respective optical fibre ends. Furthermore, said device comprises a means for positioning the holding arangement and the contact element pairs at a predetermined position relative to one another, at which a respective optical fibre end is associated with a pair of contact elements, the connection surfaces of the contact elements of said pair of contact elements being pressed onto one another by a pressure applied by said optical fibre. A means for compensating different distances between the optical fibre ends and the surfaces of the associated contact element pairs facing said optical fibre ends is provided so that the connection surfaces of all the contact elements to be connected are pressed onto one another.

The present invention provides a device for electrically connecting contact elements by means of laser energy, said device permitting the simultaneous production of a plurality of connections in which two respective contact elements are interconnected, and said device permitting a rapid and reproducable production of connections even in the case of very small contact geometries; a uniformly high quality of the connections produced and a good exploitation and conversion of the laser energy is given. The present invention is based on the finding that a good exploitation of the laser energy is achieved when the pressure for minimizing the distance between the contact elements is applied to the connection points, i.e. the contact elements, directly through the optical fibres through which the laser energy is conducted.

In order to guarantee that the connection surfaces of all contact elements to be connected are pressed onto one another when a plurality of connections is being produced, a means for compensating different distances between the optical fibre ends and the surfaces of the contact element pairs to be connected is provided according to the present invention. It is thus possible to use the present invention for producing high-quality connections essentially simultaneously with good exploitation of the laser energy, even if the surfaces which constitute part of the contact element pairs to be connected and which face the optical fibres are not positioned precisely in one plane.

In accordance with preferred embodiments of the present invention, the means for compensating different distances between the optical fibre ends and the surfaces of the contact element pairs facing said optical fibre ends is defined by a flexible foil which is transmissive with regard to the wavelength of the laser energy used and which is located between the optical fibre ends and the surfaces of the contact element pairs facing said optical fibre ends. In accordance with further preferred embodiments, the compensating means is integrated in the holding arrangement by spring-type mounting of the optical fibres in said holding arrangement.

By means of the optical fibres of the connecting device according to the present invention, which conduct the laser radiation to the points to be connected, the laser radiation can optimally be converted into thermal energy used for the connecting operation, i.e. for welding or soldering, so that unsatisfactory connection points caused by insufficient heat as well as excessive heating, which might destroy the contacts, are avoided. In view of the fact that the optical fibre ends are brought into direct contact with a surface of the contact elements to be connected, deposits which may perhaps occur at the end of an optical fibre will not influence the coupling in of the laser energy, effected for converting said laser energy into thermal energy used for producing the connection, to the same extent to which said coupling in of laser energy is influenced in cases where a distance is maintained between the end of an optical fibre and the connection point. Furthermore, the pressing together of the contact elements, which is guaranteed according to the present invention for all connections even in the case of an essentially simultaneous production of a plurality of connections, will increase thermal coupling, the effective contact surface between the individual contact elements increasing rapidly during the soldering period; this results in optimum thermal coupling with the contact elements to be connected.

The present invention is specially suitable for producing connections between connecting leads and solder connection surfaces on a substrate or chip. Due to the essentially simultaneous contacting of a plurality of connection points, very short processing times per component are possible in accordance with the present invention.

The present invention is e.g. particularly suitable for producing connections between conductors of a flexible circuit carrier and contact points of a substrate or a chip. The flexible circuit carrier is defined by a foil which is transmissive with regard to the wavelength of the laser radiation used, whereby the laser energy passes through the foil almost without any losses and is absorbed and converted into heat only on the surface of the connecting lead, which consists e.g. of copper. Due to this heat and the contact force during the contacting process, an electrically conductive connection is established between conductors of the flexible circuit carrier and contact points of the substrate or chip. Further advantages are to be seen in the fact that the laser energy is converted into heat only below said flexible foil material, e.g. on a copper conductor. Hence, problems with the heat-transmission resistance and problems with the thermal conduction of the foil will be avoided. Furthermore, the adhesive layers in the flexible circuit carrier will be prevented from being destroyed by excessively high temperatures.

The present invention can also provide means for coupling the laser energy of a laser into the plurality of optical fibres. Furthermore, means for supervising the connection operation between the respective contact elements can be provided. With the aid of these means, corrective measures can be taken by a control device for compensating e.g. the existence of dirt on the fibre end faces.

Further developments of the present invention are disclosed in the dependent claims.

BRIEF DESCRIPTION OF THE DRAWINGS

Preferred embodiments of the present invention will be explained in detail hereinbelow making reference to the drawings enclosed, in which:

FIGS. 4A to 5D show schematic representations for explaining a further embodiment of the device according to the present invention;

DESCRIPTION OF PREFERRED EMBODIMENTS OF THE INVENTION

Figure 1:
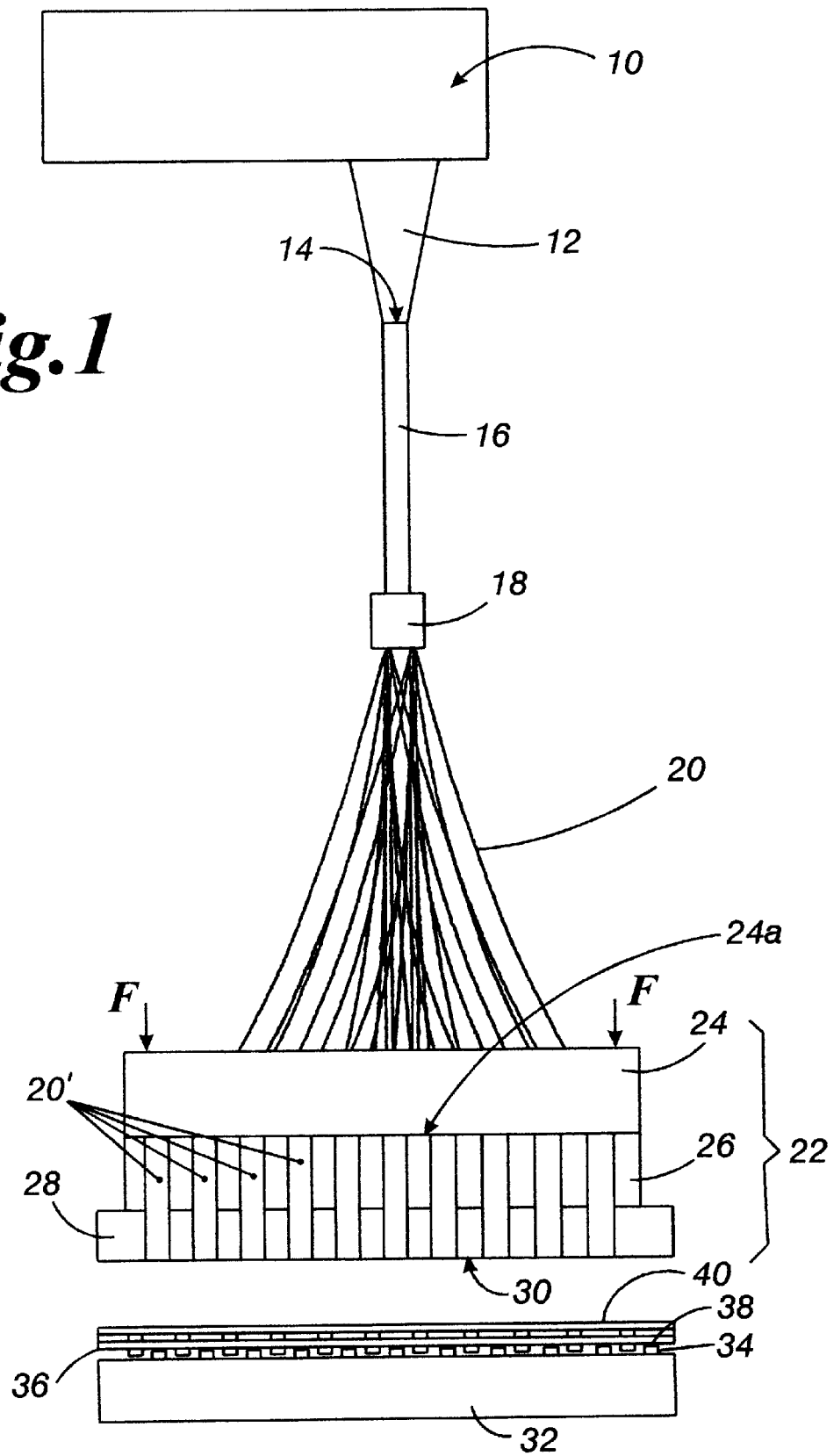
FIG. 1 and FIG. 2 show schematic representations for explaining one embodiment of the device according to the present invention.

Referring to FIG. 1, a first embodiment of the present invention will be explained hereinbelow. In so doing, the TAB method will be used as an example for explaining the present invention; it is, however, apparent that the device according to the present invention is also suitable for other connecting methods.

FIG. 1 shows a laser source 10, which can be a commercially available laser source for producing a laser light having a specific wavelength, the radiation of said laser source being focussed with the aid of an imaging means 12 onto the end face 14 of an optical waveguide 16 facing said laser source 10. The optical waveguide 16 is coupled to a plurality of individual optical fibres 20 by means of a fibre coupler 18. Alternatively, the optical waveguide 16 can also consist of a fibre bundle; in this case, the use of a fibre coupler can be dispensed with.

In addition, a holder, designated generally by reference numeral 22, is provided in accordance with the present invention; according to the preferred embodiment of the present invention, said holder 22 has provided therein a plurality of holes or recesses, a single optical fibre 20 passing through each of said holes or recesses. In the case of the embodiment shown, the holder comprises a first and a second surface, which extend parallel to each other, the holes with the embedded optical fibres 20' terminating perpendicularly on these surfaces. The holes in said holder are preferably arranged in accordance with a geometrical array of connection points, i.e. a connection point pattern.

In the embodiment shown in FIG. 1, the holder 22 comprises a first holding element 24 consisting of a rigid material, a second holding element 26 consisting of an elastic material, and a third holding element 28 which may consists of an elastic or of a rigid material. The holes are formed such that they extend through all three holding elements 24, 26 and 28 in alignment with one another. The second holding element 26 is attached to the first holding element 24 on the surface 24a facing away from the laser source 10. The third holding element 28 is attached to the surface of the second holding element 26 on the surface facing away from the first holding element 24. The third holding element 28 can also be referred to as yoke. The holding elements 24, 26 and 28 are interconnected e.g. by means of an adhesive. The yoke 28 serves to fine-position the optical fibres 20' arranged in the holes, and, in particular, it serves to fine-position the fibre end faces 30 of said optical fibres 20' in accordance with the connection point pattern. The height of the yoke 28 is chosen such that the fibre end faces 30 define together with the free surface of said yoke 28 a continuous planar surface.

In the embodiment shown, the optical fibres 20' can be guided freely in said first holding element 24 as well as in said third holding element 28, i.e. they are not fixed. In addition, the optical fibres are attached to the elastic holding element 26 e.g. by means of an adhesive. The holding element 24 consisting of a rigid material is adapted to be acted upon by a force in the direction of the arrows F.

In FIG. 1, a chip or a substrate 32 is additionally shown on which a plurality of solder contact points 34 (pads, bumps) is arranged. A TAB foil (film) 36 is arranged on top of said substrate; respective connecting leads 38, which are attached to said foil 36, being brought into superposition with the solder contact points 34 on the substrate 32. In FIG. 1, a further foil layer 40 consisting of a flexible material is optionally arranged on top of said TAB foil 36.

Figure 2:
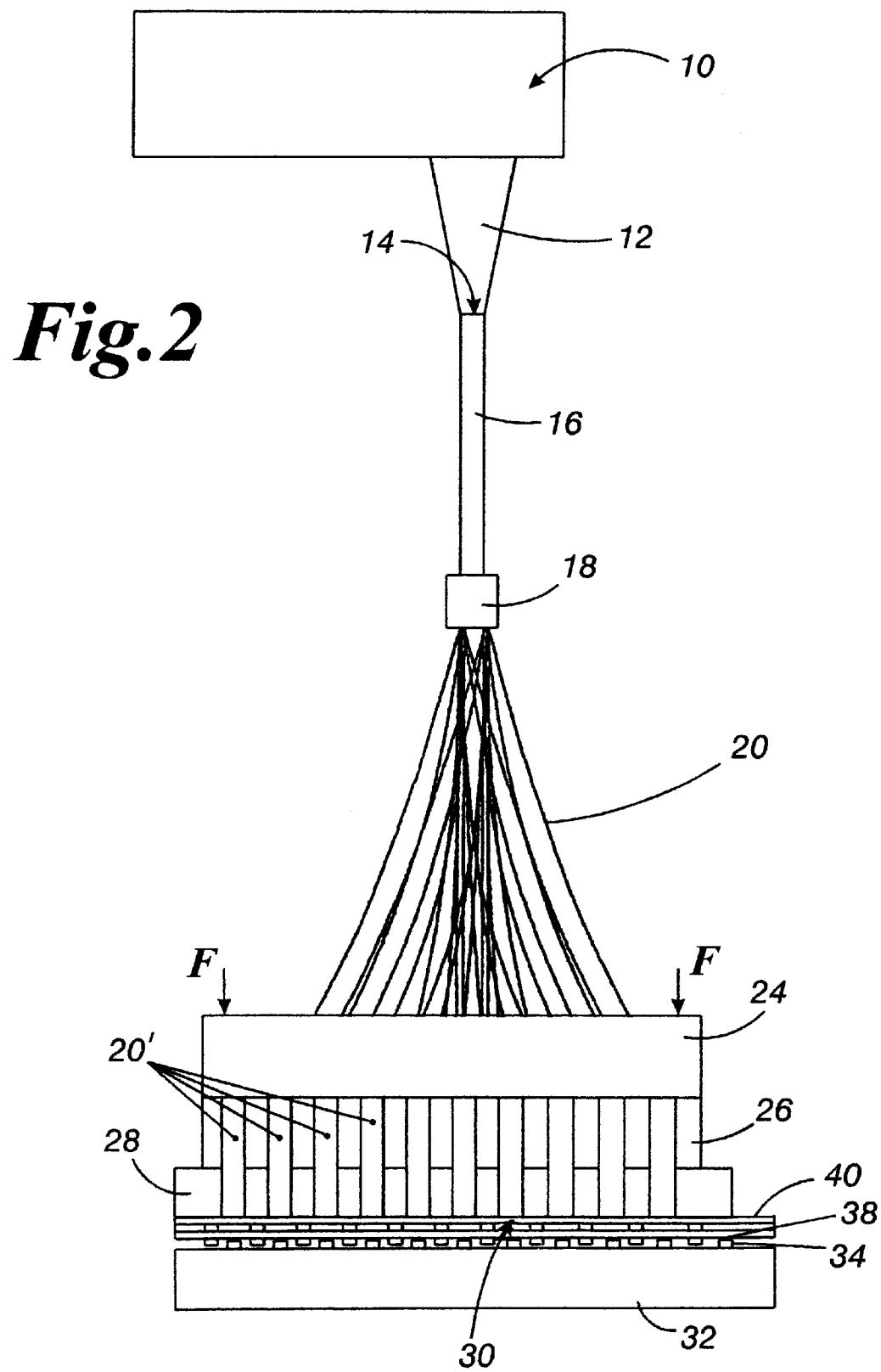

In the representation according to FIG. 1, the holder 22 has not yet been brought into alignment with the contact elements to be connected, i.e. the solder contact points 34 and the connecting leads 38, and it does not yet occupy the connection position. The present invention provides for this purpose a device (not shown), which may be a commercially available positioning device, for positioning the holder 22 and, consequently, the optical fibre ends 30 at a position where they show a predetermined relationship with the contact elements to be connected. In so doing, the surface of the holder 22 constituting the lower surface in FIGS. 1 and 2 is oriented relative to the chip 32 in such a way that each optical fibre 20' has its optical fibre end 30 positioned precisely opposite a connection point between the solder contact point 34 and the connecting lead 38. Subsequently, the holder 22 is moved towards the component, i.e. the chip 32, until the optical fibre ends 30 come into contact with the connection points, i.e. with the flexible foil 40 in the case of the embodiment shown. In so doing, a predetermined bonding force F is applied to the first holding element 24, said bonding force being transmitted to the individual optical fibres 20' via the second holding element 26 producing a spring-type effect. Hence, each individual optical fibre applies a predetermined pressure to the respective connection point between the solder contact point 34 and the connecting lead 38. By means of the second holding element 26 producing a spring-type effect, it is guaranteed that the force is transmitted uniformly to all optical fibres 20', and, consequently, identical contact and bonding pressures will be produced at all connection points when the optical fibres ends 30 have identical geometrical dimensions. The holder 22 is now located at the predetermined position relative to the chip 32 and, consequently, also relative to the contact points to be connected.

Subsequently, a laser radiation produced by the laser source is coupled into the individual optical fibres 20 through the imaging device 12, the optical waveguide 16 and the fibre coupler is according to the embodiment shown. The laser light can be produced in a continuous or in a pulsed mode of operation. The laser light is conducted by the optical fibres 20 through the holes and guided to the connection points. At the connection points, the laser light is absorbed by at least one of the two contact elements. The flexible foils 36 and 40 are in this case transparent to the laser light having the wavelength used. Due to the heat, i.e. the temperature, developed by the absorption and the contact pressure applied, a connection is established between the contact elements. It follows that, by providing a plurality of optical fibres 20 whose ends 30 are in alignment with a plurality of contact elements to be connected, connections between two respective contact elements can be produced with a reproducable quality by means of the device according to the present invention under identical and reproducable conditions with regard to pressure and temperature.

As will be described more precisely hereinbelow, especially with reference to FIGS. 4A to 5D, the present invention permits a compensation of different heights of the contact element pairs to be connected due to the fact that the optical fibres are resiliently held in the holder. In the embodiment shown in FIGS. 1 and 2, this compensation is supported by the provision of an optional, additional elastic foil 40. The elastic foils, the TAB foil 36 as well as the additional foil 40, are, however, not a necessary feature of the present invention. As has been described hereinbefore, the optical fibres 20' are only attached to the second holding element 26 consisting of elastic material, which may, for example, be plastic foam. Alternatively, the optical fibres can additionally be attached in a resilient manner to the holes of the first holding element 24, e.g. by means of an elastic adhesive.

In the above-described embodiment of the present invention, the spaces between the optical fibre ends and the surface of the first holding element 24 facing the substrate are filled with an elastic material 26 and a yoke 28. The elastic material may consist e.g. of an elastic plastic material. This elastic material is applied to the surface of the first holding element 24 in the form of a layer in such a way that, firstly, the optical fibres project beyond the layer of elastic material, the projecting length being the same in the case of all optical fibres, and, secondly, the pieces of the optical fibres extending within said layer of material are completely surrounded by elastic material. This will improve the mechanical stability and, consequently, the service life of the optical fibre end pieces 20'. The yoke 28 shown in FIGS. 1 and 2 is optional; said yoke can be omitted in the case of an alternative embodiment. The yoke 28 is applied to the layer of material 26 and can consist of the same material as said layer of material 26. Alternatively, the yoke 28 can consist of a very hard material, since this third holding element 28 has the function of correcting the individual optical fibres 20' at their positions in such a way that the geometrical distances between the optical fibres correspond very exactly to the connection point pattern on the chip 32. By means of the holes in the first holding element 24 and the arrangement of the optical fibres 20' in the second holding element 26, only a coarse preadjustment is normally provided. Inaccuracies resulting therefrom can be corrected by applying the yoke 28 which serves to adjust the positions of the optical fibres precisely. The material used for the yoke 28 preferably has a temperature expansion coefficient which is very small and isotropic so that exact positioning of the fibres will also be guaranteed when the yoke 28 is brought into contact with a very hot surface during the contacting process. Using e.g. a silicon substrate, the yoke 28 can be structured and/or etched in separate steps in correspondence with the connection point pattern. This permits a very precise production of the geometrical dimensions of the holes in the yoke 20 in correspondence with the connection point pattern. In the case of the normally used optical fibres having a cylindrical covering, the holes in the yoke 28 are preferably provided in the form of cylindrical holes; this has the effect that, on the one hand, the optical fibre conducted through such a "hole" will be positioned very precisely at the predetermined position and that, on the other hand, the fibre will be arranged in the hole with a sufficient amount of play to render the friction between the cylindrical inner wall of the hole of the yoke and the fibre comparatively small so that an almost friction-free relative movement between the yoke and the optical fibres is possible. As has already been mentioned, the yoke can be secured to the surface of the second holding element 26 e.g. by means of an adhesive. The heights of the second holding element 26 and of the third holding element 28 are preferably chosen such that the total height of these elements corresponds precisely to the length of the optical fibre end pieces 20' so that the fibre end surfaces 30 and the lower surface of the yoke 28 are located in one planar surface.

The measure of arranging the fibre end surfaces and the lower surface of the yoke 28 in one planar surface is advantageous in several respects. When the contacting process of connection points is carried out through an intermediate foil, as has been shown in FIGS. 1 and 2, pressure will be applied to said foil not only at the connection points but also in the entire area outside of said connection points, whereby a connection between the contact elements will be established and a planarization of the surface of the foil will be effected simultaneously. Due to the pressure applied by the optical fibres and the fusion of material of the contact elements, a reduction of volume occurs at the connection points and this results in a formation of depressions in the foil at the connection points. These depressions are reduced by the pressure which is simultaneously applied to the areas outside of the connection points whereby planarization to a very high degree is achieved.

The effect described hereinbefore is especially achieved when the material used for the yoke is much harder and stiffer than the material used for the foil, this being e.g. the case when a silicon yoke is used. This applies in a corresponding manner to embodiments where, instead of the foil, a different material is used as a contact partner.

When a planar surface exists, an adhesive bonding process can be carried out outside of the connection points simultaneously with the application of pressure to the connection partners by the optical fibres. It follows that, in a single step, many connections can be establised at the connection points, e.g. by soldering, whereas adhesive bonding processes between materials, e.g. between a foil and the surface of a layer extending below said foil, can be carried out simultaneously in other areas.

The embodiment described has the additional advantage that the pressure applied to the surfaces outside of the connection points can be adjusted within wide limits by selecting the materials for the second holding element and the third holding element, especially by selecting the elastic material for the second holding element. Furthermore, it will be advantageous when the material of the yoke 28 absorbs or reflects the laser light to a high degree, since laser light which escaped from the optical fibres due to faults or due to damage which may be caused to the fibre can then not reach the surface areas between the connection points of the component. Hence, the component cannot be damaged in these surface areas due to an excessive thermal load caused by the laser light. The same applies to an elastic foil arranged between the yoke 28 and the component and to layers extending below said foil.

Depending on the surface material of the component outside of the connection points, the material of the yoke can be chosen such that the yoke material will be prevented from bonding chemically and/or physically with the surface material of the component during the contacting process. For this purpose, the yoke can also be coated with a suitable material. In particular, wetting of the yoke by the surface material, which can e.g. be a solder, must be excluded so that it is not necessary to clean the contacting areas of the yoke after the contacting process.

According to the described embodiment of the present invention, the force F applied to the holder is transmitted almost exclusively to the end faces 30 of the optical fibres 20 and only a negligible percentage thereof is transmitted to the yoke surface which is located in one plane with said fibre end faces 30. This has the effect that, during the contacting process, the optical fibres 20 are pressed onto the respective contact elements, whereas the yoke surface "recedes" due to the elasticity of the second holding element in particular. The more elastic the second and possibly the third holding element are, the higher the number of connection points that can be produced simultaneously will be, when a predetermined force is applied to the holder and when a predetermined minimum bonding pressure, i.e. a minimum contact pressure, of an optical fibre acts on the associated contact element pair.

Figure 3:
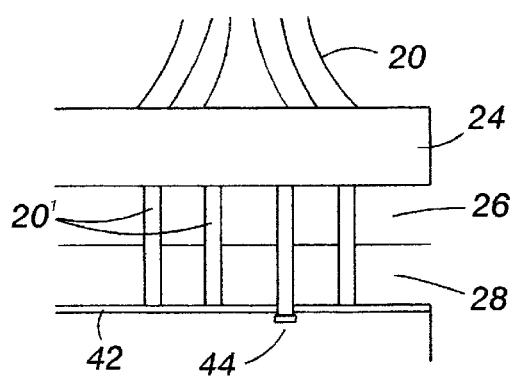
FIG. 3 shows a schematic representation for further explaining the mode of operation of an embodiment of the present invention.

In FIG. 3 an enlarged detail of FIG. 2 is shown—not to scale—said detail including the first holding element 24, the second holding element 26 and the third holding element 28 as well as a foil 42. In FIG. 3, it is clearly shown that, when, due to the connection of the two contact elements, the material shrank at point 44, the respective optical fibre end piece automatically followed the depression in the foil 42, the contact with the foil and, consequently, the application of pressure to the contact elements being maintained in this way. It follows that the bonding force is reproducably maintained at a connection point and an escape of laser radiation is prevented; due to the increase in temperature of the surrounding, absorbing material, such an escape of laser radiation could result in destruction of the chip or circuit carrier. In this way, coplanarity during bonding is guaranteed; especially, irregularities in the foil or a slightly angular orientation of the holder relative to the surface of the foil are compensated for.

Figure 4A:
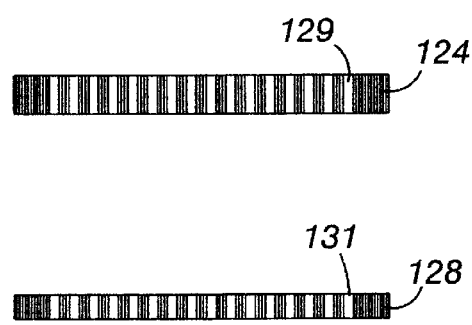
Figure 4B:
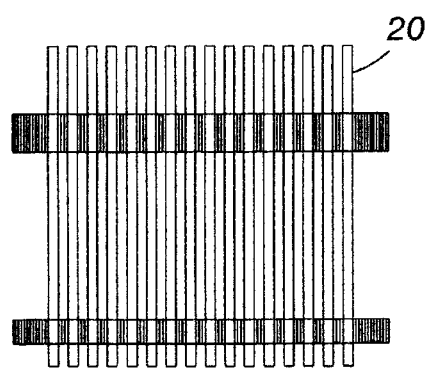
Figure 4B:
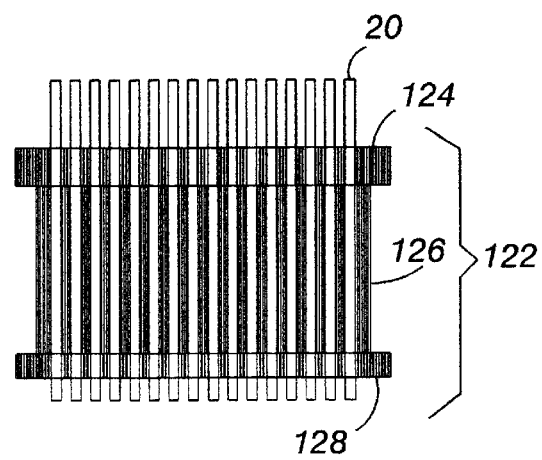

Making reference to FIGS. 4A to 5D, it will be explained hereinbelow how, according to the present invention, irregularities of contact element pair surfaces facing the holder are compensated for. In FIG. 4C, a finished holder 122 is shown, whereas FIGS. 4A and 4B show steps for producing the same. As can be seen in FIG. 4A, a first holding element 124 consisting of a rigid material as well as a third holding element 128 consisting of a rigid material as well are first provided. The holding elements L24 and 126 are provided with holes 129 which face one another. For this purpose, the platelike elements are preferably first provided with suitable holes.

The holding elements 124 and 128 are arranged in the manner shown in FIG. 4A e.g. in a suitable carrier. Subsequently, the optical fibres 20 are conducted through the holes 129 in said first holding element 124 and the holes 131 in said third holding element 128, the pattern and diameter of said holes 131 corresponding to those of holes 129, as can be seen in FIG. 4B. It is in this connection advantageous that the diameter of the fibres is only slightly smaller than the diameter of the holes. The fibres are not fixed in the holes. As can be seen in FIG. 4c, the space between the first holding element 124, the third holding element 128 and the optical fibres 20 is then filled with a flexible material 126, e.g. a plastic material or an adhesive. In the embodiment described with regard to FIGS. 4A to 5D, the fibres 20 project beyond the yoke 128 on the side of the yoke facing away from the flexible material 126, as can be seen in FIG. 4c. FIGS. 4B to 5D do not show that, on the other hand, the optical fibres 20 extend at the other end thereof, again by way of example, via various optical guide and imaging systems to a laser source, as can be seen e.g. in FIGS. 1 and 2.

FIG. 5A corresponds to FIG. 4C with the difference that the holding element 124 is acted upon by the bonding force F. FIG. 5B shows a substrate 132 with connection contact elements 134 whose upper surfaces are not planar. In order to make things clearer, FIG. 5B shows markedly non-planar surfaces of the connection contact elements 134.

In FIG. 5c, the substrate 132 is arranged on a carrier 135, e.g. on a table. The holding arrangement 122 is arranged relative to said substrate 132 in such a way that the respective optical fibre ends of the optical fibres 20 are in alignment with the connection contact elements and apply a pressure thereto. The connection contact elements 134 represent respective contact element pairs in FIGS. 5B and 5C. It is not necessary to provide an elastic foil between the contact element pairs and the optical fibre ends, but such a foil can optionally be provided, e.g. in the case of TAB bonding. In the schematic representation of FIG. 5C, it can be seen how the non-planarity of the connection contact elements 134 is compensated for by means of the elastic material 126 and the way in which the optical fibres 20 are resiliently fixed to said elastic material 126, i.e. the way in which the fibres are resiliently fixed in the holding arrangement 122. As can clearly be seen from the bulged deformation of the elastic material 126, said elastic material essentially contributes to this compensation of the non-planarity.

Figure 5D:
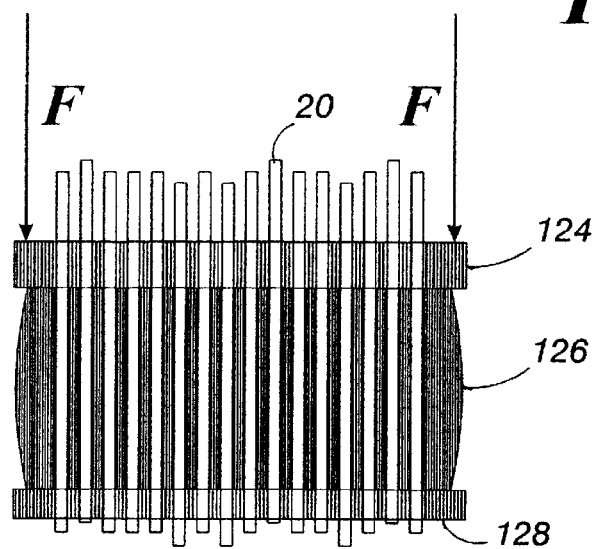

In order to show this compensation even more clearly, FIG. 5D again shows the holding arrangement, now separately, after the contacting process; in this figure, it can clearly be seen that, when the holding arrangement 122 has been lifted off the substrate 132, the fibres in said holding arrangement would return to the positions shown in FIGS. 4C and 5A. FIG. 5D only serves to show the displaceability of the individual fibres due to the spring-type fixing of said fibres in the holding arrangement.

Figure 6:
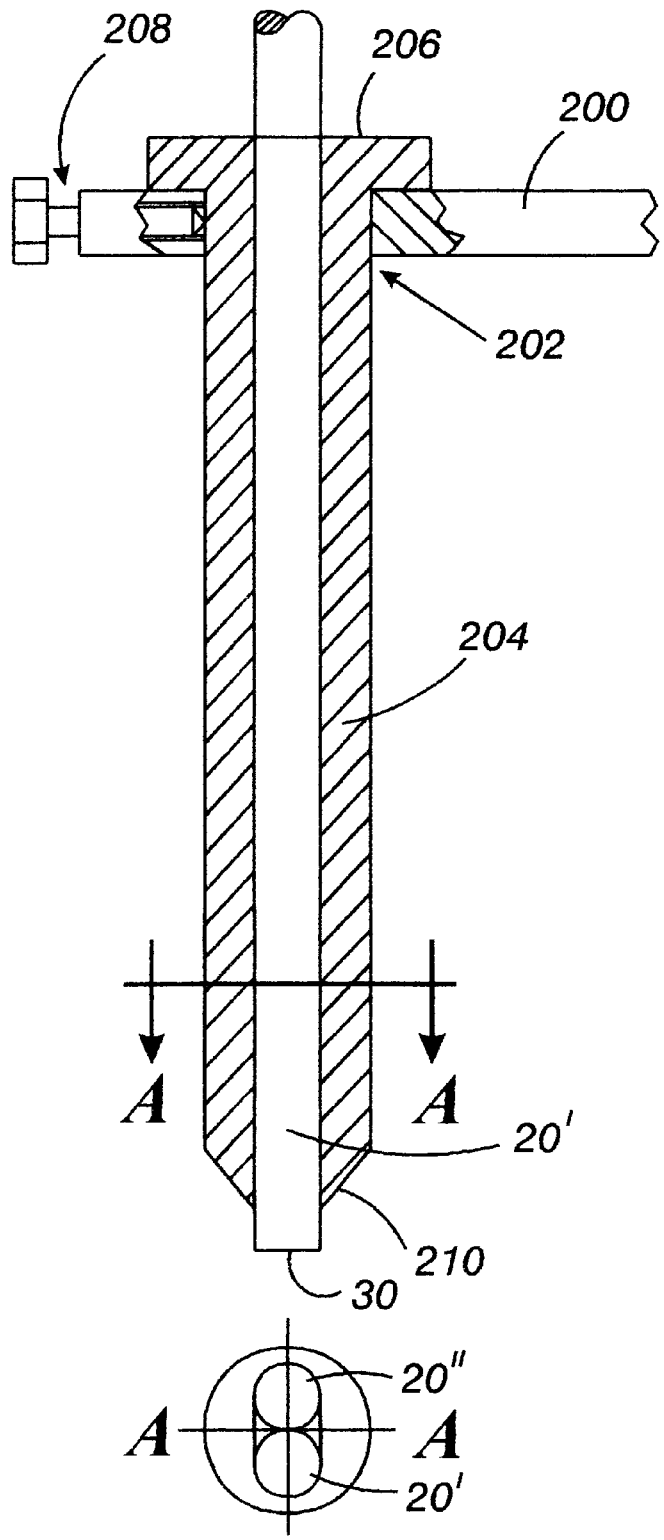
FIG. 6 shows d schematic cross-sectional view tor explaining a further embodiment of the present invention.

FIG. 6 shows a further embodiment of a holding arrangement which simultaneously provides a compensation device according to the present invention. FIG. 6 shows, however, only a detail of such a holding arrangement. A holding element 200 consisting of a rigid material is provided with a through hole 202. It is obvious that, according to the present invention, such a holding element 200 will be provided with a plurality of through holes 202 so as to permit a plurality of glass fibres to be held resiliently. In said through hole 202 a tubular holding element 204 consisting of a flexible material is arranged in the form shown. The tubular holding element 204 is attached to said through hole 202 by means of a flange 206 and a clamping device 208, which, as can be seen in FIG. 6, may consist e.g. of a screw. A glass fibre 20', which is not connected to the tubular holding element 204, is arranged in said tubular holding element 204. The glass fibre is placed in position in the through hole 202 due to the influence of the clamping device 208 on the flexible tubular holding element 204. As can be seen in the figure, the glass fibre end 30 of the glass fibre 20' projects beyond the lower end 210 of the tubular flexible holding element 204, which can be bevelled. The glass fibre end 30 is the end which applies pressure to the pair of contact elements when a connection is being established.

In the lower area of FIG. 6, a sectional view along line A—A is shown. In the embodiment shown, two fibres 20' and 20" are freely guided in the tubular flexible holding element 204. It is, however, apparent that it is also possible to guide only one fibre or another number of fibres in each tubular holding element. The holding and compensation device described with reference to FIG. 6 provides sufficient flexibility for compensating irregularities of the surfaces of contact element pairs facing the glass fibres. This compensation is effected by the flexibility of the tubular holding element and by the flexibility of the glass fibres themselves.

It follows that, in the embodiment shown in FIG. 6, irregularities existing on the substrate or resulting from the contacting process are compensated for by an elastic deformation or bending of the glass fibres below the point where they are fixed. This guarantees that the glass fibre used for contacting is constantly pressed onto the contact point during the bonding process. Also irregularities caused by a reduction of the volume of an optionally used foil during the bonding process are compensated for in this way; these irregularities might cause a reduction of the bonding force applied to the contact points, if not all fibres take part in the bonding process simultaneously, as will be explained in greater detail hereinbelow.

Figure 7:
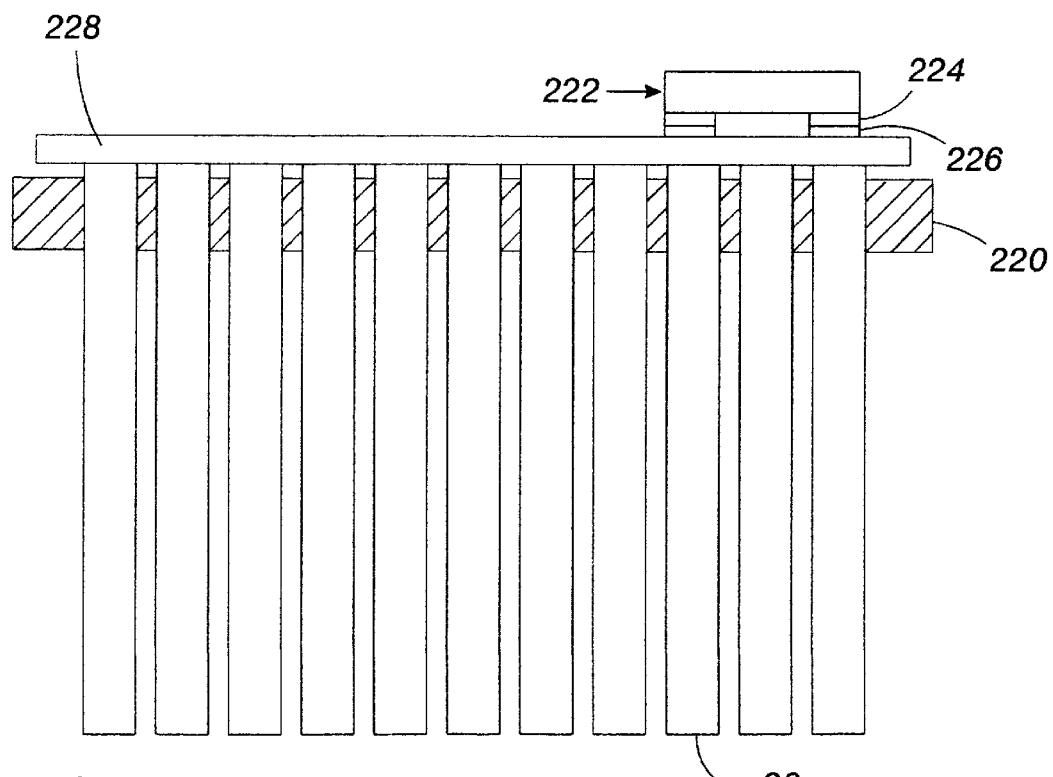
FIG. 7 shows a schematic representation for explaining a further embodiment of the present invention.

FIG. 7 shows a schematic representation for explaining a further embodiment of the present invention. In the embodiment shown in FIG. 7, glass fibres 20 are fixely attached to a rigid holding arrangement 220. The holding arrangement 220 can again have a platelike shape with through holes extending therethrough. FIG. 7 additionally shows a component 222 with contact surfaces 224 which are to be connected to connecting leads 226 on a flexible substrate 228.

In order to realize the connection, the rigid holding arrangement 220 and the glass fibres 20 are arranged opposite the contact element pairs 224, 226 in such a way that respective glass fibre ends are located opposite said contact element pairs and apply a pressure thereto. Following this, laser energy is conducted through the glass fibres 20 and the flexible substrate 228 onto the contact element pairs so that by converting the laser energy into thermal energy said contact element pairs are connected. The flexible substrate 228 must be transparent with regard to the wavelength of the laser radiation used. The flexible substrate can e.g. be a foil substrate. In the case of this emodiment, the foil substrate also acts as a compensating device according to the present invention, since the fibres are rigidly fixed to the holder 220.

When a foil is used in this way, e.g. for carrying out flip-chip bonding, the wavelength of the laser light used must be so chosen in conformity with the foil material that the foil absorbs as little laser light as possible and that, consequently, almost the whole amount of energy reaches a contact element absorbing this energy. It follows that, in accordance with this embodiment, the end faces of the optical fibres extending from the second surface of the holder are brought into contact with the foil in such a way that the laser light penetrating through said foil impinges precisely onto a connection point located below said foil. For many known foil materials wavelengths of from approx. 800 nm to approx. 1,100 nm are suitable, this being a wavelength region where increasingly powerful diode lasers are available.

Returning to FIG. 7, the fibre bundle comprising the optical fibres 20 is fixed from below in a suitable holder in the case of the embodiment shown in said figure. The holder 220 can be a stationary table. Subsequently, the foil 228 or the flexible substrate are arranged on the glass fibre ends in such a way that the respective glass fibre ends are located opposite the contact elements of the foil. Following this, components can be positioned, e.g. by means of a pick-and-place device, on the foil, which is located above the glass fibre ends and provided e.g. with conductors 226, and pressed against these conductors and, consequently, against the glass fibre end faces located therebelow. Subsequently, laser energy is again coupled into the individual glass fibres by means of a suitable device so that all the contact points located on the arrangement can be contacted in one operation.

Alternatively to the embodiment shown in FIG. 7, the glass fibres can resiliently be attached to the holder 220 also in this case, e.g. for the purpose of supporting the compensation of irregularities.

As can be seen in FIGS. 1 and 2 of the present application, the laser light discharged by a laser can be coupled into the plurality of individual optical fibres 20 by means of a coupling device 18. For imaging the laser light discharged from the laser onto the individual optical fibre end faces of the fibre bundle facing the laser, optical or opto-mechanical or electrooptical devices and methods can preferably be used. The device which can preferably be used for this purpose is an optical collimating optics, e.g. a lens, which, by mechanical displacement and positioning in a plane extending at right angles to the direction of the laser beam, is moved in such a way that the laser light is coupled into each individual one of the optical fibres in temporal succession. This method is a time-sequential coupling-in method.

Figure 8:
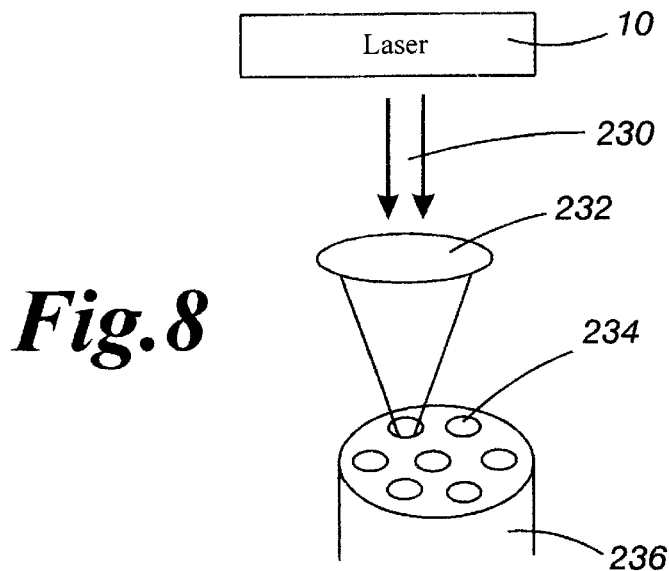
FIG. 8 shows a schematic representation for explaining a coupling-in device.

In FIG. 8, a laser source 10 is schematically shown; the laser radiation 230 of this laser source can be coupled into each individual fibre 234 of an optical fibre conductor 236 in temporal succession by means of a lens 232 which is adapted to be moved at right angles to the direction of the laser beam. The optical fibre conductor can correspond to the optical waveguide shown in FIG. 1, the fibre coupler 18 being superfluous due to the existence of the individual fibres 234 merging directly with the optical fibres 20. In the embodiment shown in FIG. 8, the coupler is, however, already arranged above the optical waveguide 16, FIG. 1.

Alternatively to the embodiment described hereinbefore, the laser light can, according to an additional embodiment of the present invention, be imaged onto the whole cross-section of the end face of the fibre bundle and, consequently, it can be coupled simultaneously into each individual optical fibre. In order to enhance the degree of coupling in, it will be advantageous to arrange the individual optical fibres of the bundle such that they extend as closely to one another as possible and/or to splice them together so that, in the final analysis, the percentage of the area onto which laser light is imaged, but which does not contribute to the coupling in of said laser light into one of the optical fibres, is reduced. The Laser light can be imaged simultaneously, i.e. optically parallel, onto each optical fibre end face which is suitable for coupling in by means of a collimating optics. Since an imaging of laser light onto surfaces which are not suitable for coupling in does not take place in this case, a high coupling efficiency is achieved.

Figure 9:
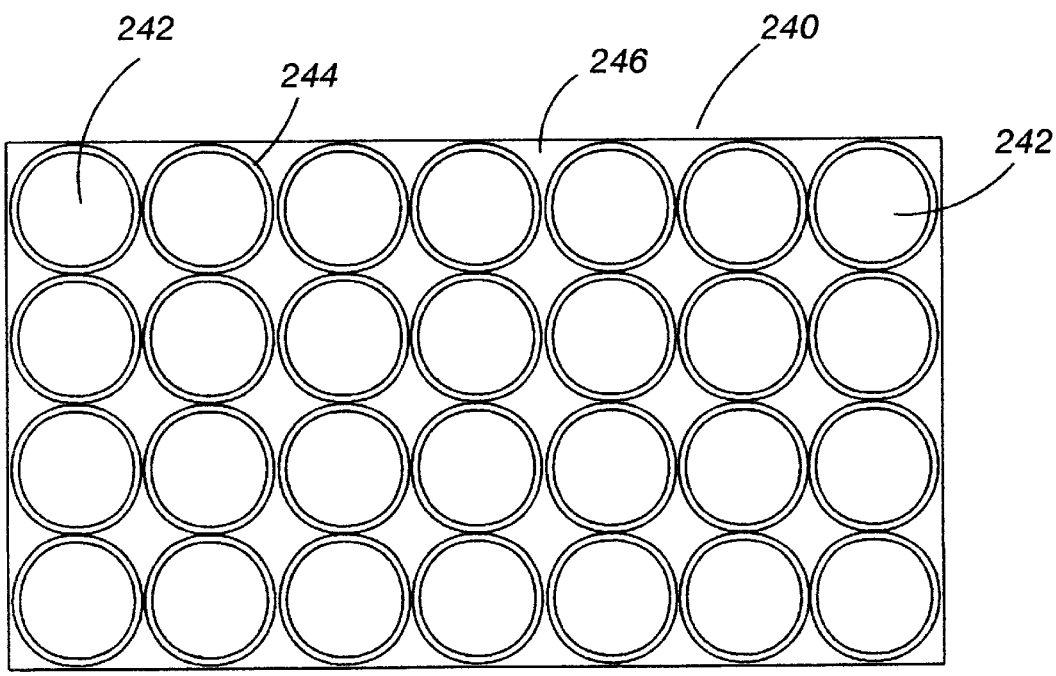
FIG. 9 shows a sectional view of an optical fibre bundle which is adapted to be used in connection with the present invention.

A top view of a section of the end face of such a suitable fibre bundle 240 is shown in FIG. 9. The fibre bundle 240 comprises a plurality of optical fibres 242; in the detail according to FIG. 9, 32 optical fibres 242 are shown. Each of the said optical fibres is provided with a copper cladding 244, the outer diameter of the optical fibres 242 as well as the thickness of the copper layer 244 on these fibres being known very precisely. The individual fibres 242 are fixedly soldered together via the copper coating 244. This results in a rigid connection of all optical fibres which is extremely insusceptible to mechanical vibrations. In addition the geometrical dimensions and positions of each individual fibre 242 are determined very precisely and known. Due to the firm soldered connection between the individual fibres, these fibre positions are also stable for a long period of time, and this results, in the final analysis, in a highly defined and good coupling in of laser light.

As can be seen in FIG. 9, the stability of the fibre arrangement can be increased by introducing a connection material 246. The copper cladding 244 has additionally the effect that, in the case of faulty imaging of the laser light, e.g.

onto the rim of the fibre, the resultant heat will be dissipated rapidly. Excess heat will already be discharged to the surroundings at a distance of approx. 10 cm from the end face. This heat dissipation prevents the fibre arrangement from being damaged in the area of the end face by "misled" laser light. The naturally low light absorption of copper, viz. approx. 4%, can be reduced still further by polishing the outer surface of the copper. In addition, copper is a very robust material, and the rigid fixing of all optical fibres permits rapid cleaning and polishing of the end face of the fibre arrangement. Hence, very smooth fibre end faces can be obtained, and this will hive the effect that light can be coupled in even more effectively.

Figure 10:
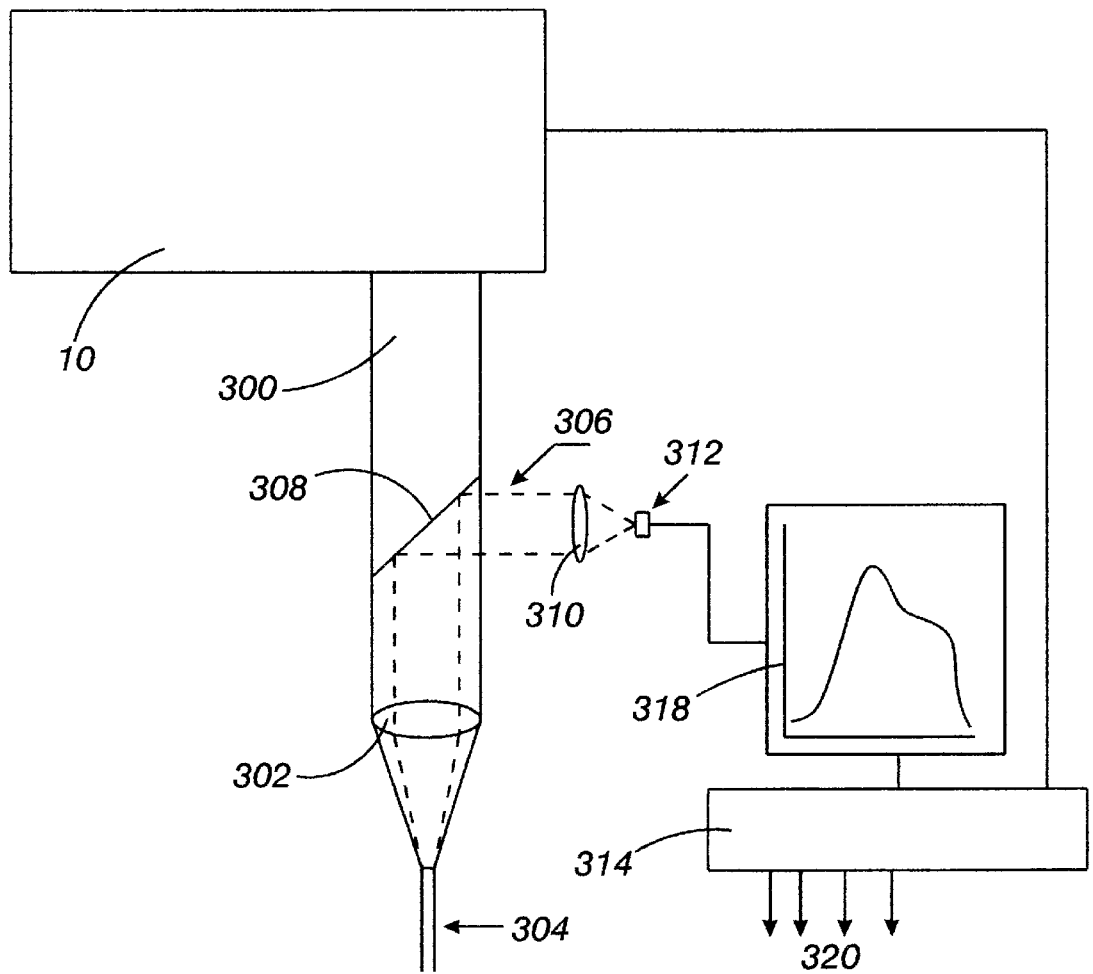
FIG. 10 shows a schematic representation of a device for controlling the temperature at connection points and, consequently, tor supervising the connection process.

In FIG. 10, a device is shown which can be used for supervising the connection process between two respective contact elements. As far as this supervision is concerned, the temperature is of utmost importance, since, if the temperature changes, the absorption behaviour of the contact surfaces changes as well. Absorption is a material-specific quantity which normally depends on the wavelength and on the intensity of the laser light as well as on the temperature T; possible losses caused by reflection and transmission can be determined. In the device shown in FIG. 10, which can be used for supervising the connections established by means of the connection device according to the present invention, the temperature and the absoprtion behaviour are detected via the infrared laser radiation reflected by the contact elements.

As can be seen in FIG. 10, and as has already been explained hereinbefore with reference to FIGS. 1 and 2, the laser radiation 300 produced by a laser source is imaged into an optical fibre bundle 304, e.g. by means of a converging lens 302. The further extension of the optical fibre bundle ending in the optical fibres, which are attached e.g. to a holding arrangement, is not shown in FIG. 10.

During the connection process, infrared laser radiation is reflected by the pairs of contact elements. This reflected radiation is represented by broken lines 306 in FIG. 10. This reflected radiation 306 impinges on a semi-reflecting mirror 308, is reflected by this mirror and reaches an infrared detector 312 via a further converging lens 310. The infrared detector is connected to a control device 314, e.g. a computer. The control device has stored therein predefined desired characteristics 318 for the temperature behaviour of the soldering operation with which the detected temperature behaviour is compared. The control device 314 is additionally connected to the laser source 10 so that the laser parameters can be controlled. The control device 314 can also be connected to additional sensors at connections 320.

The device described with reference to FIG. 10 is e.g. suitable for correcting e.g. an increase in the absorption at the fibre end faces caused by dirt on said end faces. Furthermore said device can be used for detecting e.g. wear at the end of one of the optical fibres, whereupon the deficiencies in question can be eliminated by means of suitable measures, e.g. with the aid of cutting or grinding tools.

The additional sensors, which can be connected to the control device at 320 and which can be provided for process control and supervision, may, for example, be a force and a displacement pick-up as well as an ultrasonic detector, which supply to the control device 314 information on the lowering of the contact elements, the layer thickness of the soldering tin and the melting process at the soldering point. On the basis of these quantities, further control of the connection process can be effected. By means of the control device, it is also possible to realize individually different bonds on a substrate or carrier by storing contacting parameters, such as the pressure, the laser energy, the pulse width or the like.

When the device according to the present invention is e.g. used for bonding gold connecting leads to tin-coated solder connection surfaces, a neodymium JAG laser having a wavelength of 1.06 μm can, for example, be used for heating the gold and for soldering it to the tin-coated solder connection surfaces. When the device according to the present invention is used, the pressure for pressing the contact elements together can, in the case of sensitive substrate materials, be reduced to such an extent that it only serves to overcome the bending stiffness of the elements and to eliminate the gap between the contact elements to be connected. Depending on the preselected boundary conditions, it is also possible to carry out contacting, also without solder bumps, directly on the substrate and the semicondutor element, respectively, with a solder metallization. The optical fibres consist preferably of a quartz material having a melting temperature of approx. 1,880 Kelvin so that faults caused by a thermal load on the fibres will not occur.

It has already been mentioned that, in cases in which a foil is used between the fibre end faces and the contact elements to be connected, said foil must be transmissive with regard to the wavelength of the laser energy used. If, after having been discharged from an optical fibre end face, the laser light impinges, however, directly on the contact elements, without having to penetrate a foil previously, a more flexible selection of the laser light will be possible. In this case, the highest possible absorption of the laser light by at least one of the contact elements as well as the handling characteristics and the size of the laser light source can be taken into account to a higher degree upon selecting the laser energy.

In the case of alternative embodiments of the present invention, the optical fibres 20 can again be provided with a copper cladding; commercially available multimode optical fibres have typical outer diameters of approx. 200 μm to 400 μm and a copper layer thickness of approx. 10 μm to 40 μm. Due to this metallization, the optical fibres are mechanically reinforced whereby their stiffness is increased and their tendency to break is reduced, a circumstance which is of essential importance especially with regard to the end pieces of the optical fibres. The copper metallization of the fibres can be reinforced still further by a layer of nickel applied. This nickel coating can preferably be effected in the area of the optical fibre end pieces from the end faces to the point where said optical fibres are resiliently fixed in the holder.

The above-mentioned nickel layer on a copper-clad fibre can form a ring of increased thickness around the fibre at the point where the fiber is resiliently fixed in the holder, i.e. it can define a spring plate. The resilient material of the resilient fixing is then arranged in side-by-side relation with and in contact with the spring plate and has the shape of an adhesive hose or of an elastic hose of plastic material enclosing the fibre at least in this area. As soon as the end face of an optical fibre end piece is pressed against the connection point, the spring plate will be pressed against the resilient material as well. If, due to the connection established, a local reduction of the volume of the contact element material occurs, the resilient material will advance the optical fibre end piece via the spring plate to such an extent that the local reduction of volume is compensated for whereby the contact between the fibre end face and the connection point is maintained.

In accordance with an alternative embodiment of the present invention which is not shown, the fibre bundle can be attached to a lateral surface of the holder; in this case, attention should, however, be paid to the fact that the necessary curvatures of the optical fibres in the holder do not result in optical losses or that excessive optical losses are at least avoided. This embodiment is advantageous insofar as the hole first surface of the holder is available for applying the bonding force to the holder, and this is an advantage especially in cases where holders with small geometrical dimensions are used. In addition, this embodiment is advantageous for contacting very small chips, since the demanded uniformity and stability of the bonding pressures at the fibre end faces can be guaranteed by the extremely uniform application of force according to this embodiment.

To those skilled in the art, it will be apparent that the number and the position of the optical fibres, which are held by the holding arrangement, can be selected. The number and the positions of the optical fibres can, for example, correspond to the number and the positions of the contact element pairs, i.e. the connection points, in accordance with one embodiment. It is, however, also possible to provide a number of optical fibres which is larger than the number of connection points provided. In this case, means are provided, which permit the laser light to be switched off in the optical fibres which are not used for producing a connection. Such means can also be used in cases where, although a connection point associated with an optical fibre exists, said connection point is not to be heated. In addition, devices can be provided which permit the laser light to be switched on and off in each individual optical fibre. In this way, a large number of different connection point patterns can be adjusted easily and rapidly with the aid of a single holder and optical fibre arrangement. The switching on and off can preferably be realized via programmable control means and/or with the aid of a computer. The switching on and off is preferably realized at the point where the laser light discharged by the laser light source is imaged onto the end face of a bundle of fibres comprising a plurality of optical fibres, as has been described hereinbefore. Also the above-mentioned deflection means, with the aid of which the laser light can be imaged onto each individual fibre and, consequently, coupled into each individual fibre in temporal succession, is a device of this type. The deflection means is then controlled in such a way that the laser light is only coupled into the desired optical fibres. The switching on and off can also be effected by means with the aid of which the absorption of the laser light for or in a specific optical fibre is changed to a high degree.

In accordance with alternative embodiments of the present invention, the number of optical fibres guided in the holder can be smaller than the number of connection points. The above-mentioned means for switching the laser light on and off in the individual fibres can also be used in this case. If the connection point pattern shows a certain regularity or symmetry, the contacts between the contact elements can be produced at all connection points by locally displacing the holder and by carrying out a plurality of temporally successive contacting operations. A regularity of the connection points which is particularly suitable for this type of method is e.g. given when the distance between neighbouring connection points is a multiple of a minimum distance. The above-mentioned multiple-contacting method can also be used in cases where the distance between two respective connection points is smaller than twice the outer diameter of the optical fibres whose typical outer diameter is approx. 200 μm to 400 μm. In this case, it is impossible to arrange the fibres at so small a distance from one another that two neighbouring connection points can be contacted at the same time. Hence, the contacts at a first part of the connection points will in this case be produced in a first contacting operation, e.g. at each second or next but one connection point. Subsequently, the holder will be locally displaced and reoriented, whereupon a second contacting operation is carried out. This can be repeated until all desired contacts have been produced.

According to the present invention, the holding arrangement for the optical fibres can be brought to the described position relative to the contact element pairs by means of arbitrary known positioning devices. It is, however, also possible to arrange the holding arrangement rigidly; in this case, positioning devices are provided for bringing the contact element pairs, which are arranged e.g. on a substrate, to the described positions relative to the holding arrangement By means of the pressure applied by the optical fibre end faces, a gap between the contact elements to be connected is eliminated and improved thermal conduction is made possible according to the present invention. For this purpose, the holder of the optical fibres or, alternatively, a carrier of the contact element pairs has a force applied thereto, whereupon the laser light is conducted through the optical fibres to the connection points for a defined period of time so as to establish the connection by converting the laser energy into thermal energy. When the laser energy has been switched off, the fibre ends can remain at the predetermined position relative to the contact element pairs until the soldering point has cooled down. The period of cooling down can be reduced in this way, and this results in a higher speed of the whole soldering operation.

What is claimed is:

1. A device for producing by laser energy a plurality of connections between contact elements of respective contact element pairs which are arranged essentially in one plane, the contact element surfaces to be connected extending essentially parallel to this plane, said device comprising the following features:
    a holding arrangement holding a plurality of optical fibres having respective optical fibre ends;
    a means for positioning the holding arrangement and the contact elements pairs at a predetermined position relative to one another, at which a respective optical fibre end is associated with a pair of contact elements, the connections surfaces of the contact elements of said pair of contact elements being pressed onto one another by a pressure applied by said optical fibre end; and
    a means for compensating different distances between the optical fibre ends and the surfaces of the associated contact element pairs facing said optical fibre ends, in such a way that the connection surfaces of the contact elements are pressed onto one another.

2. A device according to claim 1, wherein said means for compensating different distances is implemented such that the connection surfaces of the contact elements are pressed onto one another with a substantially identical pressure.

3. A device according to claim 1, wherein the holding arrangement is fixedly positioned and wherein the means for positioning the holding arrangement and the contact element pairs at a predetermined position relative to one another is a means for positioning the contact element pairs.

4. A device according to claim 1, wherein the contact element pairs are fixedly positioned and wherein the means for positioning the holding arrangement and the contact element pairs at a predetermined position relative to one another is a means for positioning the holding arrangement.

5. A device according to claim 1, wherein the holding arrangement is provided with a plurality of through holes through which the plurality of glass fibres extends.

6. A device according to claim 1, wherein the optical fibres are rigidly attached to the holding arrangement, and wherein said compensating means is defined by a flexible foil which is transmissive with regard to the wavelength of the laser energy used and which is located between the optical fibre ends and the surfaces of the contact element pairs facing said optical fibre ends.

7. A device according to claim 1, wherein said compensating means is defined by a flexible mounting for retaining the optical fibres in the holding arrangement.

8. A device according to claim 7, wherein the holding arrangement comprises a holding element consisting of a rigid material and provided with a plurality of through holes, which are in alignment with the through holes of a flexible component connected to said holding element of rigid material, said optical fibres being arranged in said through holes and connected to said flexible component.

9. A device according to claim 8, wherein the optical fibre ends are arranged such that they are essentially flush with the surface of the flexible component facing away from the holding element of rigid material.

10. A device according to claim 8, wherein the holding arrangement additionally comprises a holding yoke provided with a plurality of through holes and connected to the flexible component in such a way that the through holes of these two elements are in alignment with one another, and that the flexible component is arranged between said holding element of rigid material and the holding yoke, the optical fibres being not fixed to the through holes of the holding yoke.

11. A device according to claim 10, wherein the optical fibre ends terminate such that they are essentially flush with the surface of the holding yoke facing away from the flexible component.

12. A device according to claim 11, wherein the holding yoke consists of a flexible material.

13. A device according to claim 11, wherein the holding yoke consists of a rigid material.

14. A device according to claim 10, wherein the holding yoke consists of a rigid material, the optical fibre ends projecting beyond the surface of the holding yoke facing away from the flexible component.

15. A device according to claim 8, wherein the optical fibres are not secured to the through holes of the holding element consisting of rigid material.

16. A device according to claim 8, wherein the optical fibres are flexibly arrranged in the through holes of the holding element consisting of rigid material.

17. A device according to claim 8, wherein the compensating means additionally comprises d flexible foil which is transmissive with regard to the wavelength of th laser energy used and which is arranged between the optical fibre ends and the surfaces of the contact element pairs facing said optical fibre ends.

18. A device according to claim 1, wherein the holding arrangement comprises a holding element consisting of a rigid material and provided with a plurality of through holes having arranged therein respective tubular elastic fibre holders which project in the direction of the contact element pairs beyond the holding element consisting of a rigid material, at least one optical fibre being guided in each of said tubular elastic fibre holders and the optical fibre end of said at least one optical fibre projecting beyond the end of the tubular elastic fibre holder facing the pairs of contact elements.

19. A device according to claim 18, wherein said tubular elastic fibre holders are attached to the through holes of the holding element by clamping devices.

* * * * *